United States Patent
Maria et al.

(10) Patent No.: US 6,531,354 B2
(45) Date of Patent: Mar. 11, 2003

(54) LANTHANUM OXIDE-BASED GATE DIELECTRICS FOR INTEGRATED CIRCUIT FIELD EFFECT TRANSISTORS

(75) Inventors: Jon-Paul Maria, Raleigh, NC (US); Angus Ian Kingon, Cary, NC (US)

(73) Assignee: North Carolina State University, Raleigh, NC (US)

(*) Notice: Subject to any disclaimer, the term of this patent is extended or adjusted under 35 U.S.C. 154(b) by 0 days.

(21) Appl. No.: 09/764,253

(22) Filed: Jan. 17, 2001

(65) Prior Publication Data

US 2001/0032995 A1 Oct. 25, 2001

Related U.S. Application Data

(60) Provisional application No. 60/177,010, filed on Jan. 19, 2000.

(51) Int. Cl.$^7$ .............. H01L 21/8238; H01L 29/108; H01L 29/76; H01L 29/94; H01L 31/119
(52) U.S. Cl. .............. 438/216; 438/287; 257/310
(58) Field of Search .................. 438/216, 287; 257/310

(56) References Cited

U.S. PATENT DOCUMENTS

| | | | |
|---|---|---|---|
| 5,195,018 A | 3/1993 | Kwon et al. | 361/313 |
| 5,950,103 A | 9/1999 | Hato et al. | 438/638 |
| 6,125,027 A | 9/2000 | Klee et al. | 361/320 |
| 2001/0020725 A1 * | 9/2001 | Okuno et al. | 257/410 |
| 2002/0005556 A1 * | 1/2002 | Cartier et al. | 257/381 |

OTHER PUBLICATIONS

International Search Report for PCT/US01/01502, Apr. 23, 2001.

Gasgnier, *Rare Earth Compounds (Oxides, Sulfides, Silicides, Boron, . . . ) As Thin Films and Thin Crystals*, Phys. Stat. Sol. (1) 114, 1989, pp. 11–71.

Samsonov et al., *Preparation of Thin Films of Rare Earth Oxides and Investigation of Their Physical Properties*, Inorganic Materials, vol. 10, No. 9, Sep. 1974, pp. 1417–1419.

Fromhold, Jr. et al., *An Experimental Investigation of the Dielectric Properties of Thermally Evaporated Rare Earth Oxides for Use in Thin Film, Capacitors*, Electrocomponent Science and Technology, vol. 3, 1976, pp. 51–62.

Gao et al., *Growth and Characterization of Thin Films of $Y_2O_3$, $La_2O_3$ and $La_2CuO_4$*, Journal of Solid State Chemistry, vol. 90, 1991, p. 228–233.

Gerstenberg, *Thin Film Capacitors*, Chapter 19, Handbook of Thin Film Technology, McGraw–Hill Book Company, pp. 19-1—19-36.

Chernobrovkin et al., *The Breakdown of Insulator Films*, Radio Engineering and Electronic Physics, vol. 17, No. 2, Feb. 1972, pp. 334–336.

Harrop et al., *Selection of Thin Film Capacitor Dielectrics*, Thin Solid Films, vol. 2, 1968, pp. 273–292.

Korovkin et al., *Optical and Spectroluminescent Properties of Lanthanide Orthosilicate Crystals*, Opt. Spectrosc (USSR), vol. 58, No. 6, Jun. 1985, pp. 778–780.

(List continued on next page.)

*Primary Examiner*—Olik Chaudhurl
*Assistant Examiner*—William M. Brewster
(74) *Attorney, Agent, or Firm*—Myers Bigel Sibley & Sajovec

(57) ABSTRACT

Lanthanum oxide-based gate dielectrics are provided for integrated circuit field effect transistors. The gate dielectrics may include lanthanum oxide, preferably amorphous lanthanum oxide and/or an alloy of lanthanum oxide and silicon oxide, such as lanthanum silicate ($La_2SiO_5$). Lanthanum oxide-based gate dielectrics may be fabricated by evaporating lanthanum on a silicon surface of an integrated circuit substrate. The lanthanum may be evaporated in the presence of oxygen. Lanthanum and silicon may be co-evaporated. An anneal then may be performed. Lanthanum oxide-based dielectrics also may be used for integrated circuit capacitors.

34 Claims, 9 Drawing Sheets

OTHER PUBLICATIONS

Larson et al., *XAS Study of Lanthanum Coordination Environments in Glasses of the System $K_2O$—$SiO_2$—$La_2O_3$*, Journal of Non–Crystalline Solids, vol. 130, 1991, pp. 260–272.

Felsche, *Rare Earth Silicates With the Apatite Structure*, Journal of Solid State Chemistry, vol. 5, 1972, pp. 266–275.

Guha et al., *Atomic Beam Deposition of Lanthanum– and Yttrium–Based Oxide Thin Films for Gate Dielectrics*, Applied Physics Letters, vol. 77, No. 17, Oct. 23, 2000, pp. 2710–2712.

Chin et al., *High Quality $La_2O_3$ and $Al_2O_3$ Gate Dielectrics With Equivalent Oxide Thickness 5–10Å*, 2000 Symposium on VLSI Technology DIgest of Technical Papers, 2000, pp. 16–17.

Robertson, *Band Offsets of Wide–Band–Gap Oxides and Implications for Future Electronic Devices*, J. Vac. Sci. Technol. B, vol. 18, No. 3, May/Jun. 2000, pp. 1785–1791.

U.S. patent application Ser. No. 60/214,285, Lucovsky et al., filed Jun. 26, 2000.

U.S. patent application Ser. No. 09/687,519, Narayan et al., filed Oct. 13, 2000.

\* cited by examiner

LANTHANUM OXIDE-BASED GATE DIELECTRICS FOR INTEGRATED CIRCUIT FIELD EFFECT TRANSISTORS

CROSS-REFERENCE TO PROVISIONAL APPLICATION

This application claims the benefit of Provisional Application Serial No. 60/177,010, filed Jan. 19, 2000, entitled Alternate Dielectrics For Silicon-Based Transistors.

FIELD OF THE INVENTION

This invention relates to integrated circuit field effect transistors and fabricating methods therefor, and more particularly to gate dielectrics for integrated circuit field effect transistors and fabricating methods therefor.

BACKGROUND OF THE INVENTION

Integrated circuit Field Effect Transistors (FETs) are widely used in microprocessor, logic, memory and/or other integrated circuit devices. As is well known to those having skill in the art, an Insulated Gate integrated circuit Field Effect Transistor (IGFET), often referred to as a Metal Oxide Semiconductor (MOS) device or MOSFET device, includes spaced apart source and drain regions in an integrated circuit substrate and an insulated gate on the integrated circuit substrate therebetween, wherein the insulated gate includes a gate dielectric on the integrated circuit substrate and a gate electrode on the gate dielectric opposite the integrated circuit substrate. Complementary (n-channel and p-channel) insulated gate integrated circuit field effect transistors also are widely used, wherein at least one n-channel MOSFET and at least one p-channel insulated gate field effect transistor are integrated in an integrated circuit substrate. These complementary MOSFETs also are referred to as Complementary Metal Oxide Semiconductor (CMOS) devices.

As the integration density of integrated circuit field effect transistors continues to increase, it may be desirable to reduce the thickness of the gate dielectric layer. A thinned gate dielectric layer can maintain or increase the capacitance density, notwithstanding the shrinking device dimensions. Unfortunately, as the gate dielectric layer continues to be made thinner, leakage current may increase dramatically. For example, for silicon dioxide ($SiO_2$) dielectric layers that are commonly used in integrated circuit field effect transistors, below approximately 30 Å in thickness, for each 2 Å reduction in thickness, the leakage current may increase by approximately one order of magnitude. Accordingly, it may be difficult to provide ultra-thin gate dielectric layers using conventional materials, without adversely impacting transistor performance.

Attempts have been made to use high dielectric constant layers (having permittivity greater than silicon dioxide) for gate dielectric layers. These high dielectric constant layers can provide greater capacitance for the same thickness as a conventional silicon dioxide layer. Alternatively, a thicker layer of high dielectric constant dielectric can provide capacitance that is equivalent to a thinner silicon dioxide layer. The thicker layer can, in turn, allow reduced leakage currents to be obtained.

Unfortunately, it may be difficult to replace silicon dioxide with other dielectric materials. For example, high dielectric constant materials may degrade other electrical parameters of the field effect transistors, such as flat band voltage and/or mobility. Moreover, interaction between the gate dielectric layer and the underlying integrated circuit substrate as a result of subsequent processing conditions, such as high temperature exposures, may degrade the properties of the gate dielectric layer.

SUMMARY OF THE INVENTION

Embodiments of the present invention provide lanthanum oxide-based gate dielectrics for integrated circuit field effect transistors. The gate dielectric may include a layer comprising lanthanum oxide, preferably amorphous lanthanum oxide. In other embodiments, the layer comprises an alloy of lanthanum oxide and silicon oxide, i.e., a layer comprising $(La_2O_3)_x(SiO_2)_{1-x}$, where $0<x\leq1$. In other embodiments, $0.01<x\leq1$. In yet other embodiments, $0.5<x\leq1$. In still other embodiments, $x=0.5$. When $x=0.5$, the layer corresponds to a layer of lanthanum silicate ($La_2SiO_5$).

Lanthanum oxide-based gate dielectrics may be able to satisfy at least two technology generations beyond which conventional silicon dioxide-based transistors may not be usable, due to its high permittivity. Moreover, lanthanum oxide-based gate dielectrics may be able to provide appropriate chemical reaction resistance and compatibility and/or resistance to crystallization that is desired for highly integrated field effect transistors.

In some embodiments, the layer comprising $(La_2O_3)_x(SiO_2)_{1-x}$ comprises a uniform layer of $(La_2O_3)_x(SiO_2)_{1-x}$. In other embodiments, the layer includes a first sublayer comprising $(La_2O_3)_{x1}(SiO_2)_{1-x1}$, and a second sublayer comprising $(La_2O_3)_{x2}(SiO_2)_{1-x2}$, where $x1\leq x2$. The silicon-rich layer preferably is adjacent the substrate. In yet other embodiments, a third sublayer may be provided on the second sublayer, opposite the first sublayer. The third sublayer may comprise $(La_2O_3)_{x3}(SiO_2)_{1-x3}$, where $x3\leq x2$.

Embodiments of field effect transistors according to the present invention can include a gate dielectric layer comprising lanthanum oxide, according to any of the above-described embodiments, and a gate electrode that comprises, for example polysilicon (such as degenerately doped polysilicon), Tantalum Nitride (TaN), Platinum (Pt), Ruthenium (Ru), Ruthenium Oxide (RuO), Iridium (Ir), Iridium Oxide ($IrO_2$) and/or Tantalum Silicide Nitride ($Ta_{1-x}Si_xN_y$). An integrated circuit complementary field effect transistor pair according to embodiments of the invention can include an n-channel insulated gate field effect transistor and a p-channel insulated gate field effect transistor in an integrated circuit substrate, each of which includes a gate dielectric layer comprising lanthanum oxide in any of the above-described embodiments, and a gate electrode. According to embodiments of the present invention, the gate electrode preferably comprises polysilicon, TaN, $Ta_{1-x}Si_xN_y$, and/or $IrO_2$ for the n-channel transistors and preferably comprises polysilicon, Pt, Ru, RuO, Ir and/or $IrO_2$ for the p-channel transistors.

Gate dielectrics for integrated circuit field effect transistors may be fabricated, according to embodiments of the present invention, by evaporating lanthanum on a silicon surface of an integrated circuit substrate. In some embodiments, the lanthanum may be evaporated in the presence of oxygen. In some embodiments, the lanthanum is evaporated directly on a silicon surface of an integrated circuit substrate, whereas in other embodiments, lanthanum is evaporated on a silicon dioxide layer on a silicon surface of an integrated circuit substrate. In yet other embodiments, the lanthanum can be evaporated on a silicon oxynitride (SiON) layer on a silicon surface of an integrated circuit substrate. In order to evaporate lanthanum directly on a silicon surface of an integrated circuit substrate, a native oxide may be removed from the silicon surface of the integrated circuit substrate. In order to evaporate lanthanum on a silicon dioxide layer on a silicon surface of an integrated circuit substrate, a native oxide may be allowed to form on the integrated circuit substrate and/or an oxide layer may be formed on the silicon surface of the integrated circuit substrate, for example by thermal oxidation and/or deposition. In order to evaporate lanthanum on a silicon oxynitride surface on a silicon substrate, the silicon oxynitride layer can be formed by thermal and/or plasma-assisted growth.

In yet other embodiments of the present invention, lanthanum and silicon are co-evaporated on a silicon surface of an integrated circuit substrate. Fluxes are generated to form the desired lanthanum-to-silicon molar ratio.

According to other embodiments of the invention, after evaporation, the lanthanum that is evaporated onto the silicon surface is annealed in a separate annealing step and/or as part of subsequent device fabrication. Annealing may take place at temperatures of less than about 900° C. and also may take place at oxygen partial pressures of between about $2 \times 10^{-8}$ and $2 \times 10^{-6}$ Torr. Higher annealing temperatures and/or different pressures also may be used. Molecular Beam Epitaxy (MBE) equipment may be used to evaporate lanthanum and/or co-evaporate lanthanum and silicon on an integrated circuit substrate, to form gate dielectrics according to embodiments of the invention. Pressures of at least $10^{-6}$ Torr, which are consistent with pressures used for oxide molecular beam epitaxy, may be used. Thus, this fabrication may be integrated into conventional integrated circuit manufacturing processes.

According to yet other embodiments of the present invention, lanthanum oxide-based capacitor dielectrics for integrated circuit capacitors also are provided. These lanthanum oxide-based capacitor dielectrics may be provided according to any of the above-described embodiments of integrated circuit field effect transistor gate dielectrics, and may be fabricated according to any of the above-described method embodiments, as well. Integrated circuit capacitors according to embodiments of the invention may be integrated on an integrated circuit substrate with integrated circuit field effect transistors according to embodiments of the invention, or may be provided separately. When integrated, portions of the same lanthanum-oxide layer may be used to provide both lanthanum oxide-based gate dielectrics for integrated circuit field effect transistors and lanthanum oxide-based capacitor dielectrics for integrated circuit capacitors. Moreover, portions of the same conductive layer may be used to provide both the gate electrode and an upper capacitor electrode. Integration of field effect transistors and capacitors may be used in Dynamic Random Access Memories (DRAMs), other memory devices and/or other integrated circuit devices.

DETAILED DESCRIPTION OF PREFERRED EMBODIMENTS

Figure 1:
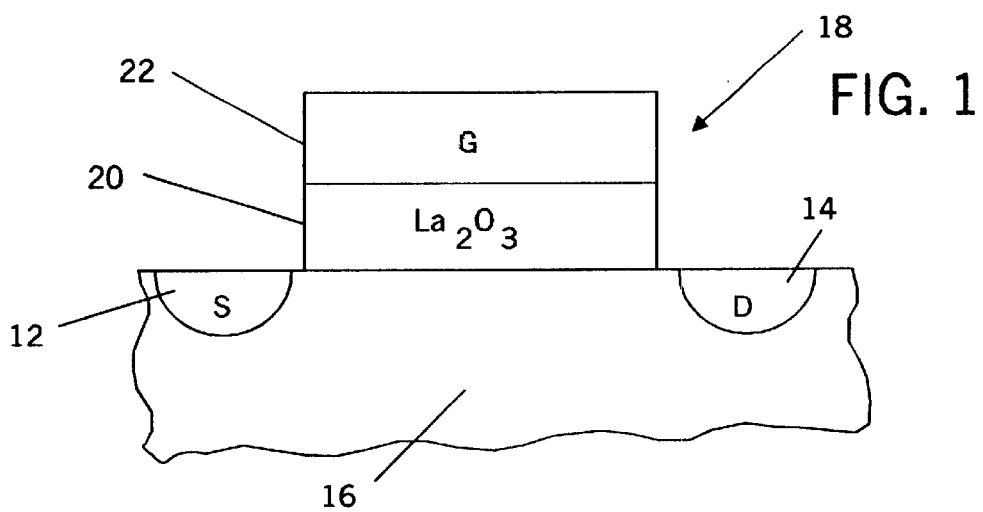
FIGS. 1–5 are cross-sectional views of integrated circuit field effect transistors including lanthanum oxide-based gate dielectrics according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Embodiments of the present invention provide gate dielectrics for integrated circuit field effect transistors, wherein the gate dielectric includes a layer comprising lanthanum oxide. In other embodiments, a layer comprising an alloy of lanthanum oxide and silicon oxide, such as lanthanum silicate, is provided.

Lanthanum oxides, including lanthanum silicate, have been mentioned in the scientific literature heretofore. See, for example, Gasgnier, Rare Earth Compounds (Oxides, Sulfides, Silicides, Boron, . . . ) As Thin Films and Thin Crystals, Phys. Stat. Sol. (1) 114, 1989, pp. 11–71; Samsonov et al., Preparation of Thin Films of Rare Earth Oxides and Investigation of Their Physical Properties, Inorganic Materials, Vol. 10, No. 9, September 1974, pp. 1417–1419; Fromhold, Jr. et al., An Experimental Investigation of the Dielectric Properties of Thermally Evaporated Rare Earth Oxides for Use in Thin Film Capacitors, Electrocomponent Science and Technology, Vol. 3, 1976, pp. 51–62; Gao et al., Growth and Characterization of Thin Films of $Y_2O_3$, $La_2O_3$ and $La_2CuO_4$, Journal of Solid State Chemistry, Vol. 90, 1991, pp. 228–233; Gerstenberg, Thin Film Capacitors, Chapter 19, Handbook of Thin Film Technology, McGraw- Hill Book Company, pp. 19–1–19–36; Chernobrovkin et al., The Breakdown of Insulator Films, Radio Engineering and Electronic Physics, Vol. 17, No. 2, February 1972, pp. 334–336; Harrop et al., Selection of Thin Film Capacitor Dielectrics, Thin Solid Films, Vol. 2, 1968, pp. 273–292; Korovkin et al., Optical and Spectroluminescent Properties of Lanthanide Orthosilicate Crystals, Opt. Spectrosc (USSR), Vol. 58, No. 6, June 1985, pp. 778–780; Larson et al., XAS Study of Lanthanum Coordination Environments in Glasses of the System $K_2O$—$SiO_2$—$La_2O_3$, Journal of Non-Crystalline Solids, Vol. 130, 1991, pp. 260–272; and Felsche, Rare Earth Silicates With the Apatite Structure, Journal of Solid State Chemistry, Vol. 5, 1972, pp. 266–275.

Deposition techniques for lanthanum oxides have been developed, according to embodiments of the invention, which appear to be compatible with conventional integrated circuit manufacturing processes. These deposition techniques include evaporating lanthanum and/or co-evaporating lanthanum and silicon on a silicon-containing surface of an integrated circuit substrate. Thermal budgets for the deposition and post-deposition processes appear to be consistent with existing technology. Moreover, the deposition may be based on Molecular Beam Epitaxy (MBE), but need not use the traditional ultra-high vacuum that is commonly associated with molecular beam epitaxy. Accordingly, these deposition processes may be integrated into conventional microelectronic device fabrication processes.

Referring now to FIG. 1, a cross-sectional view of integrated circuit field effect transistors including lanthanum oxide-based gate dielectrics according to embodiments of the present invention is shown. As shown in FIG. 1, these field effect transistors include spaced apart source and drain regions 12 and 14 in an integrated circuit substrate 16. It will be understood by those having skill in the art that the integrated circuit substrate 16 preferably is a bulk silicon semiconductor substrate or a thin silicon layer on a silicon or non-silicon substrate that may be formed using, for example, conventional Semiconductor-On-Insulator (SOI) or Separation by IMplanted OXygen (SIMOX) techniques.

Still referring to FIG. 1, an insulated gate 18 is on the integrated circuit substrate 16 between the source and drain regions 12 and 14 respectively. The insulated gate 18 comprises a gate dielectric layer 20 comprising lanthanum oxide on the integrated circuit substrate 18, and a gate electrode 22 on the gate dielectric layer 20 comprising lanthanum oxide, opposite the integrated circuit substrate. The gate dielectric layer 20 preferably comprises amorphous lanthanum oxide.

Figure 2:
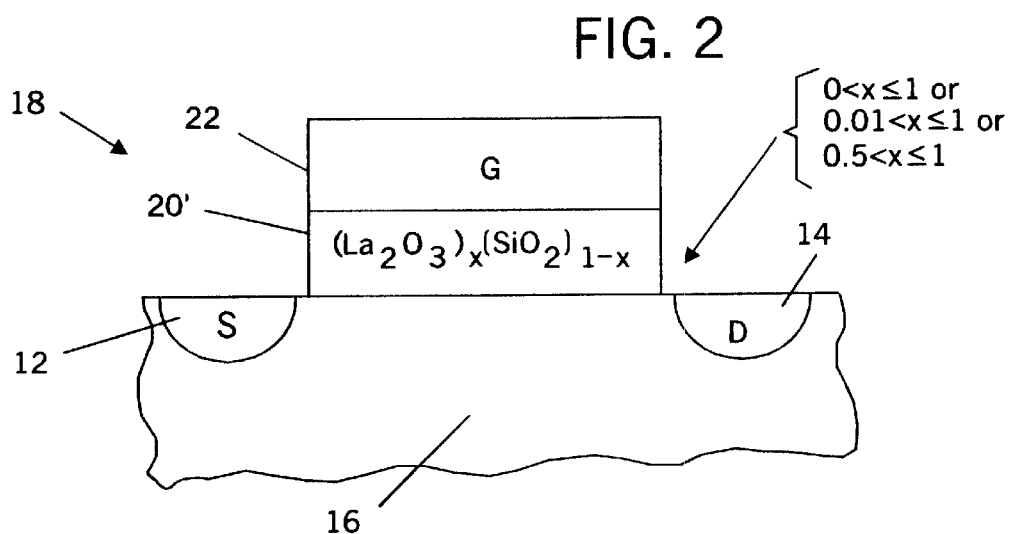

Referring now to FIG. 2, other field effect transistors including gate dielectrics comprising lanthanum oxide according to other embodiments of the present invention are shown. As shown in FIG. 2, these embodiments include gate dielectric layers 20' that comprise an alloy of lanthanum oxide and silicon oxide. As shown, in some embodiments, the layer comprising an alloy of lanthanum oxide and silicon oxide comprises $(La_2O_3)_x(SiO_2)_{1-x}$. In some embodiments, $0 < x \leq 1$. In other embodiments, $0.01 < x \leq 1$. In still other embodiments, $0.5 < x \leq 1$.

Figure 3:
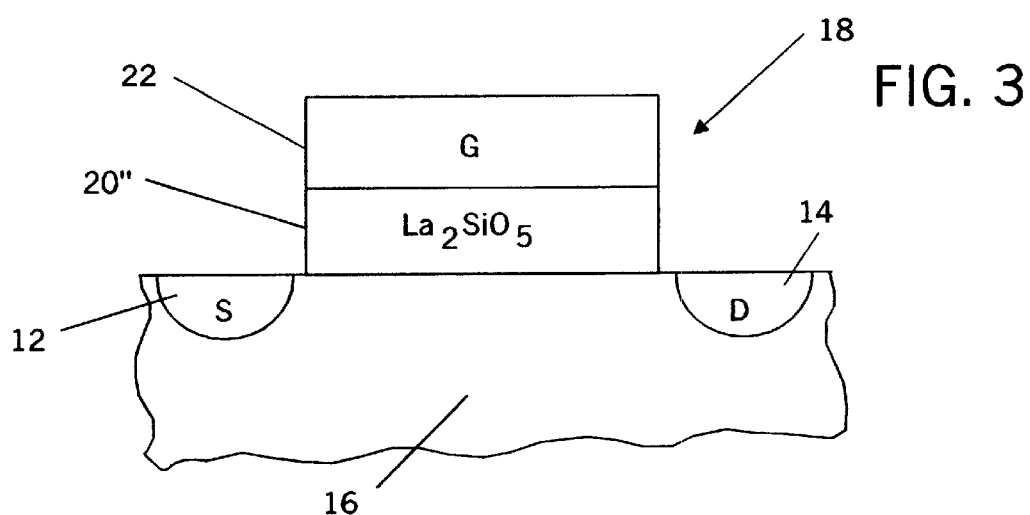

FIG. 3 is a cross-sectional view of other field effect transistors according to other embodiments of the present invention, wherein the gate dielectric layer 20" comprises $(La_2O_3)_{0.5}(SiO_2)_{0.5}$ or $La_2SiO_5$(lanthanum silicate).

Figure 4:
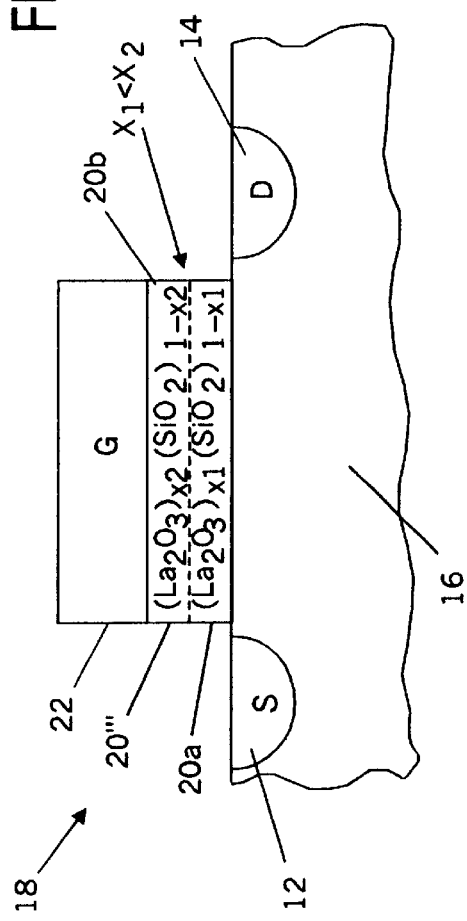

In embodiments of FIGS. 1–3, the gate dielectric layer 20, 20' and 20" is a uniform layer. In contrast, in FIG. 4, the gate dielectric layer 20'" includes a first sublayer 20a comprising $(La_2O_3)_{x1}(SiO_2)_{1-x1}$ and a second sublayer 20b comprising $(La_2O_3)_{x2}(SiO_2)_{1-x2}$, where x1 is less than or equal to x2. The silicon-rich first sublayer 20a may be formed by reaction with the silicon substrate 16, reaction with an oxide layer on the silicon substrate, diffusion of oxygen through the gate dielectric layer and/or other mechanisms, as will be described in detail below. In some embodiments, the first sublayer 20a may be between about 2 Å and about 10 Å thick and the second sublayer 20b may be between about 10 Å and about 20 Å thick. In yet other embodiments, a third sublayer also may be provided on the second sublayer, opposite the first sublayer. The third sublayer may comprise $(La_2O_3)_{x3}(SiO_2)_{1-x3}$, where $x3 \leq x2$. The silicon-rich third sublayer may be formed by reaction with a polysilicon gate electrode and/or other techniques.

In all of the embodiments of FIGS. 1–4, the gate electrode may comprise doped polysilicon and preferably comprises a conductor, such as a metal. Preferred metals include platinum. Conventional gate electrode metals such as titanium nitride and aluminum preferably are not used because they may react with the gate dielectric layer 20–20'".

Figure 5:
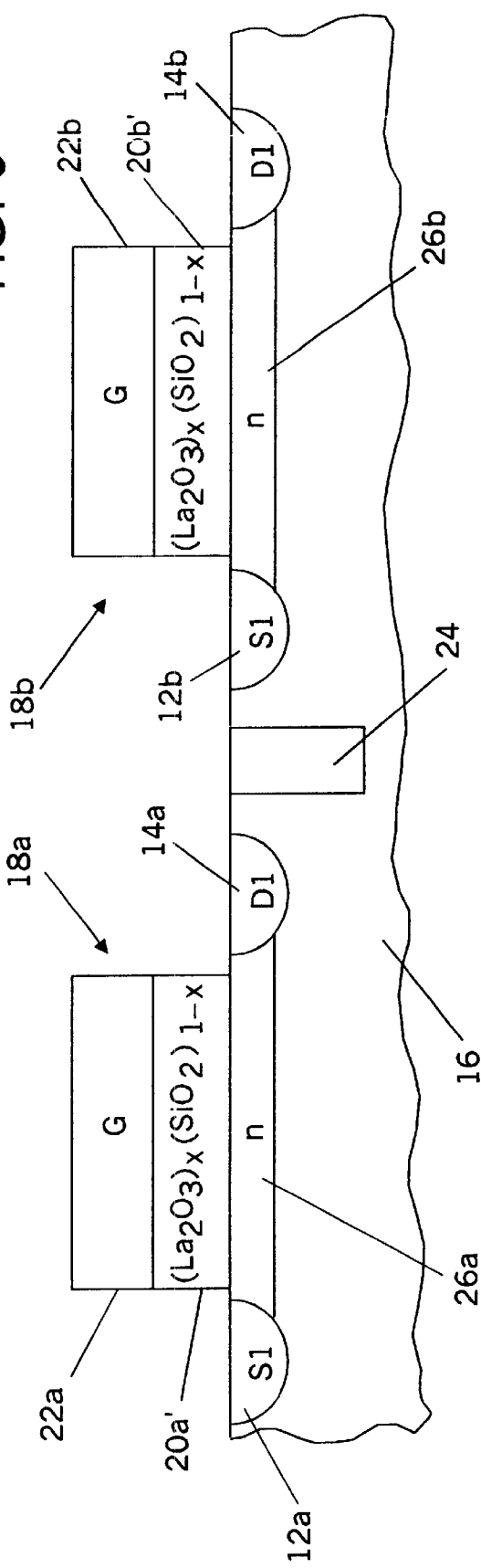

FIG. 5 is a cross-sectional view of an integrated circuit complementary field effect transistor pair, often referred to as CMOS transistors, according to embodiments of the present invention. As shown in FIG. 5, two complementary field effect transistors are formed in an integrated circuit substrate 16 and may be isolated from one another using conventional isolation, such as trench isolation 24. A first transistor may have an n-channel 26a, and may be referred to as an n-channel field effect transistor. A second transistor may have a p-channel 26b and may be preferred to as a p-channel field effect transistor. The n-channel transistor and p-channel transistor include source and drain regions 12a, 14a and 12b, 14b, respectively, and insulated gates 18a and 18b, respectively. The insulated gates 18a and 18b include a gate dielectric layer 20a', 20b', comprising lanthanum oxide. The gate dielectric layers 20a', 20b' preferably are identical but need not be so. A gate electrode 22a, 22b also is included.

The gate electrode 22a, 22b materials may comprise identical materials but preferably are not identical. For example, the gate electrodes 22a and 22b may comprise polysilicon. The polysilicon gate electrode 22a for the n-channel transistor may be doped p-type and the polysilicon gate electrode 22b for the p-channel transistor may be doped n-type. Alternatively, the gate electrodes 22a, 22b may comprise identical materials such as TaN, Pt, Ru, RuO, Ir, $IrO_2$ and/or $Ta_{1-x}Si_xN_y$. Alternatively, the gate electrode 22a for the n-channel 26a transistor may comprise one or more of the following materials: polysilicon, TaN, $Ta_{1-x}Si_xN_y$ and/or $IrO_2$; whereas the gate electrode 22b for the p-channel 26b transistor may comprise one or more of the following materials: polysilicon, Pt, Ru, RuO, Ir and/or $IrO_2$. It will be noted that $IrO_2$ has been reported to have a work function of 5.3 eV, which is the same as that of Ir, and also has been reported as having a work function of 4.2 eV. If the work function is 5.3 eV, $IrO_2$ may be more suited for p-channel transistors, whereas if the work function is 4.2 eV, it may be more suited for n-channel transistors. Moreover, if the work function is 4.2 eV, then Ir may be used for p-channel transistors, and oxidized to form $IrO_2$ for n-channel transistors in CMOS devices. Finally, any of the gate dielectric layer configurations 20–20'" of FIGS. 1–4 may be used in FIG. 5.

It will be understood by those having skill in the art that FIGS. 1–5 are greatly simplified cross-sectional views of integrated circuit field effect transistors that may omit, for example, field isolation regions, sidewall spacers and many other regions, to simplify the illustration of gate dielectrics comprising lanthanum oxide according to embodiments of the present invention.

Figure 6:
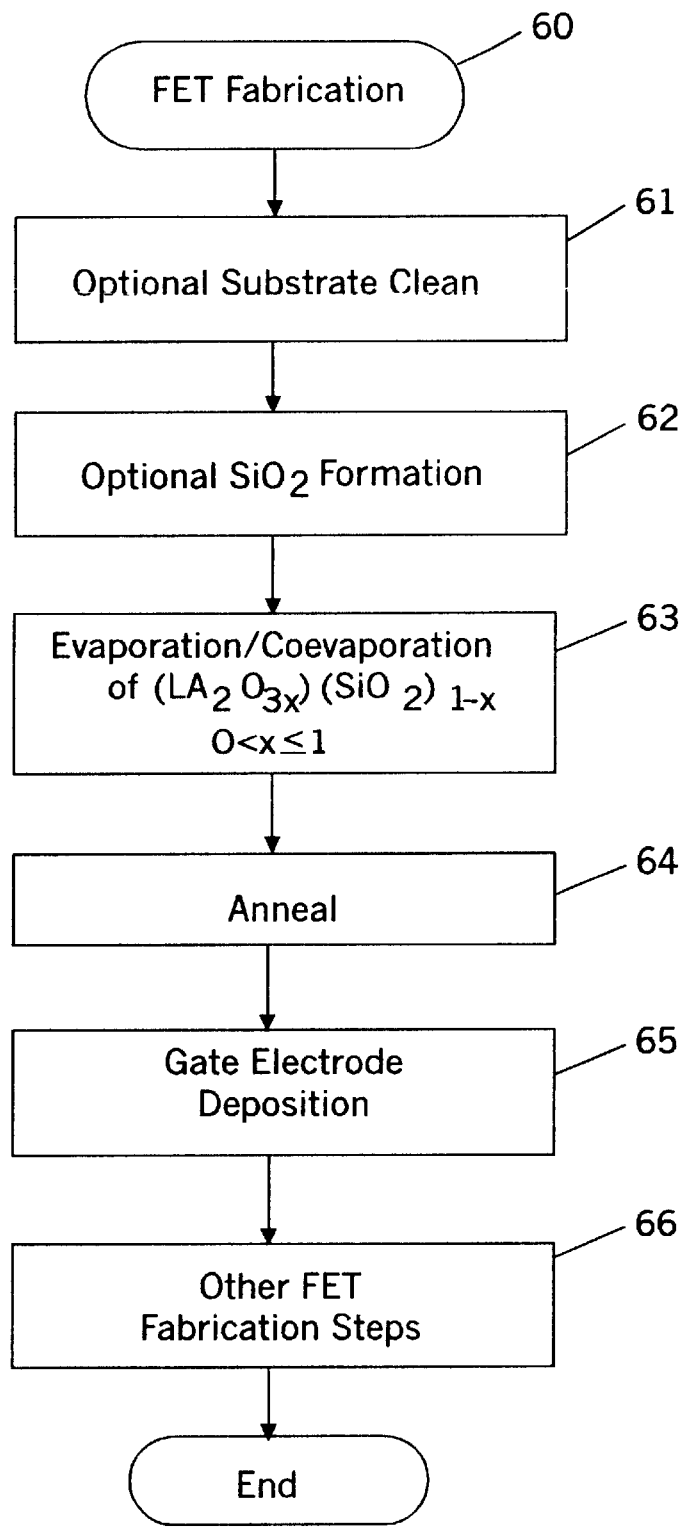
FIG. 6 is a flowchart illustrating fabrication of field effect transistors including lanthanum oxide-based gate dielectrics according to embodiments of the present invention.

Referring now to FIG. 6, a flowchart illustrating fabrication of field effect transistors according to embodiments of the present invention is shown. As shown in FIG. 6, fabrication according to embodiments of the invention can include an optional substrate clean (Block 61), optional $SiO_2$ and/or SiON formation (Block 62), and evaporation and/or co-evaporation of a layer comprising lanthanum oxide (Block 63). An optional anneal 64 also may be performed. Gate electrode deposition (Block 65) and other conventional fabrication steps (Block 66) also may be performed. It should be noted that, in some alternative embodiments of the present invention, the functions noted in the blocks may occur out of the order noted in the FIG. 6. For example, two blocks shown in succession may in fact be executed substantially concurrently or the blocks may sometimes be executed in the reverse order, depending on the functionality involved. Embodiments of FET fabrication operations of FIG. 6 now will be described in detail.

Referring again to Block 61, in one embodiment, the substrate may be an 8" monocrystalline silicon substrate, 150 mm or 200 mm thick, and may be uniformly doped with boron at a doping concentration of $10^{18}/cm_3$, to provide p-type silicon wafers. As was described above, SOI, SIMOX or other substrates also may be used.

At Block 61, an optional substrate cleaning may be provided by dipping the substrate in a 2% hydrofluoric acid concentrate solution, for example for about one to about seven minutes, to thereby reduce and preferably remove any native oxide thereon. The cleaned substrate may be stored in a vacuum, for example lower than $10^{-5}$ Torr, to provide an oxide-free and hydrogen-terminated surface for subsequent processing. In other embodiments, some or all of the native oxide may remain on the substrate, and/or may be allowed to reform.

Referring now to Block 62, the substrates are transferred, preferably without breaking vacuum, to an oxide deposition module, to form a layer of silicon dioxide thereon. Prior to deposition, the substrate may be heated to between about 200° C. and about 400° C. in an atmosphere of about $2\times10^{-6}$ Torr $O_2$. Under these conditions, due to kinetic and thermodynamic processes, a silicon surface with a minimal oxide layer, for example no greater than one monolayer, may be produced, and may be stable for many minutes. Oxide layers of greater thickness also may be formed using thermal oxidation, chemical vapor deposition, combinations thereof and/or other techniques. Alternatively, Block 62 may not be performed.

Referring now to Block 63, evaporation of lanthanum and/or co-evaporation of lanthanum and silicon may be provided. A Molecular Beam Epitaxy (MBE) processes may be used. In these processes, the slow oxidation kinetics of Si (001) surfaces at low temperatures, such as about 250° C., and low oxygen pressure, such as about $2\times10^{-6}$ Torr may be used in conjunction with an ability to dose substrate surfaces with very small and very well controlled cation fluxes. Thus, fully oxidized, high permittivity lanthanum oxide layers can be deposited without the need to form unwanted and/or additional silicon dioxide at the substrate interface.

The evaporation/co-evaporation of Block 63 may be similar to conventional MBE deposition. In particular, cation delivery may be maintained through thermal evaporation, and transport from source to substrate preferably occurs in the molecular flow regime, preferably with reduced or the absence of gas phase scattering. However, in contrast with conventional MBE evaporation/co-evaporation, Block 63 need not use ultra-high vacuum conditions during deposition. The need to maintain an ultra-high vacuum during deposition can be expensive and/or time-consuming, and thus may be regarded by many manufacturers as inappropriate for economical production.

In particular, pressure excursions less than about $10^{-6}$ Torr but greater than about $10^{-10}$ Torr, which may be used with conventional MBE, need not be used in embodiments of the present invention. In addition, the evaporation or co-evaporation can use commonly available source materials, i.e. silicon and/or lanthanum metal, as opposed to less compositionally stable "dual cation" sources or gas phase precursors which may exhibit storage instability, high toxicity and/or an explosion hazard. If pure lanthanum oxide ($La_2O_3$) is desired, only lanthanum metal may be evaporated. If an alloy of lanthanum oxide and silicon oxide is desired, then Si, $SiO_2$ and La sources may be used in the desired stoichiometric ratios. Alternatively, La and Si sources may be used or an La source alone may be used.

Lanthanum metal may be evaporated from a high temperature effusion cell using a tungsten crucible, in the presence of molecular oxygen. The chamber pressure during deposition may be $1.5\times10^{-5}$ Torr. A molecular beam approximation is appropriate at this pressure. Metal fluxes, as measured during deposition by a quartz crystal monitor, may be about $10^{15}$ atoms/$cm^2$·sec. This is approximately fifty times lower than the oxygen impingement rate at this pressure. Thus, considerable oxidation may be obtained after metal atom condensation.

A maximum deposition pressure allowed in an MBE chamber, for example approximately $3\times10^{-5}$ Torr, can establish a maximum oxygen flux possible at the substrate, and can determine the maximum cation fluxes which can be used. In this manner, the substrate surface can be dosed with quantities of both oxidant and metal appropriate for growth of fully oxygenated material.

Referring now to Block 64, an anneal then may be performed. The anneal may take place in an air furnace as a function of temperature at between about 400° C. and about 1000° C. It will be understood that a separate anneal may take place at Block 64, or the anneal may take place during other subsequent conventional processing steps. In some embodiments, a rapid thermal annealer, such as a Heatpulse Model 210 may be used for rapid thermal annealing. Rapid thermal annealing may be performed in flowing nitrogen at atmospheric pressure. Alternatively, or in addition, an anneal may take place in a vertical oxide growth furnace, such as a Model VT-1500 distributed by Semitherm. The vertical growth furnace may be operated between about 0.2 Torr and about 200 Torr. In both furnaces, reagent grade nitrogen preferably is used. Reagent grade nitrogen may contain approximately 1 part per million $O_2$. At atmospheric pressure, this can provide a partial pressure of $7.6\times10^{-4}$ Torr, and may correspond to an impingement flux of greater than $10^{16}$ molecules/$cm^2$·sec. In a vertical growth furnace, the oxygen partial pressure may be controlled by controlling the total nitrogen pressure. For example, at a minimum pressure of the vertical furnace, such as about 0.2 Torr, an oxygen pressure of $2\times10^{-8}$ Torr may be obtained.

Referring now to Block 65, gate electrodes are formed. For example, platinum may be deposited by magnetron sputtering at 250 watts using a 100 mm target, 6 cm separation distance and a 30 mTorr argon atmosphere. The electrode may be patterned by lithography and liftoff. After electrode deposition, another anneal may take place at 350° C. in 5% hydrogen, balance argon, for about 20 minutes. Other electrodes also may be formed using the materials that were described above and/or other materials, using conventional techniques.

Finally, referring to Block 66, other FET fabrication steps may be performed including field isolation, source/drain implantation and/or sidewall spacer definition. Some or all of these steps may be performed earlier and/or concurrent with some of the other blocks of FIG. 6. These and other FET fabrication steps are well known to those having skill in the art and need not be described further herein.

Figure 7:
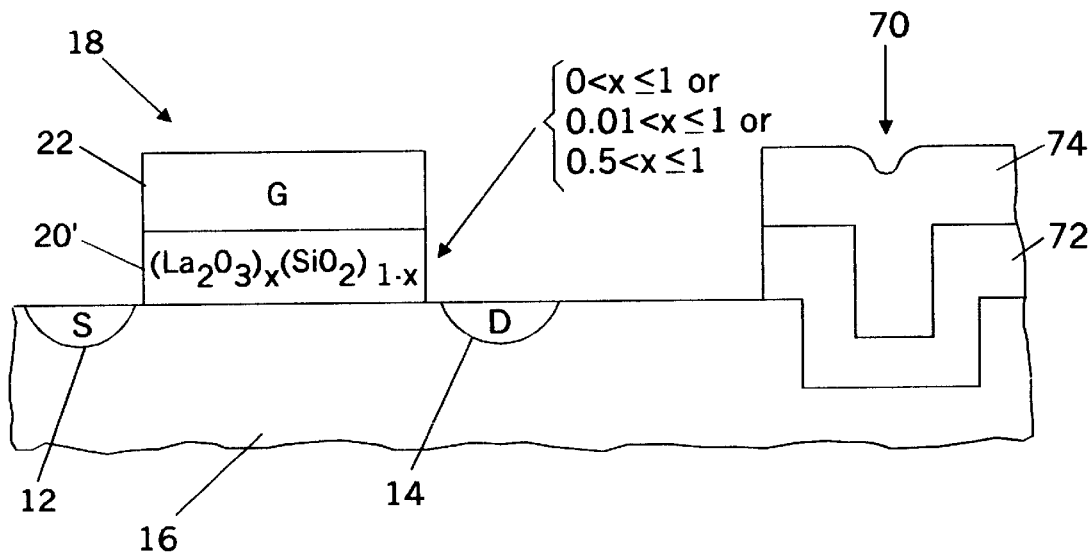
FIGS. 7–8 are cross-sectional views of integrated circuit field effect transistors and capacitors including lanthanum oxide-based gate and capacitor dielectrics according to embodiments of the present invention.
Figure 8:
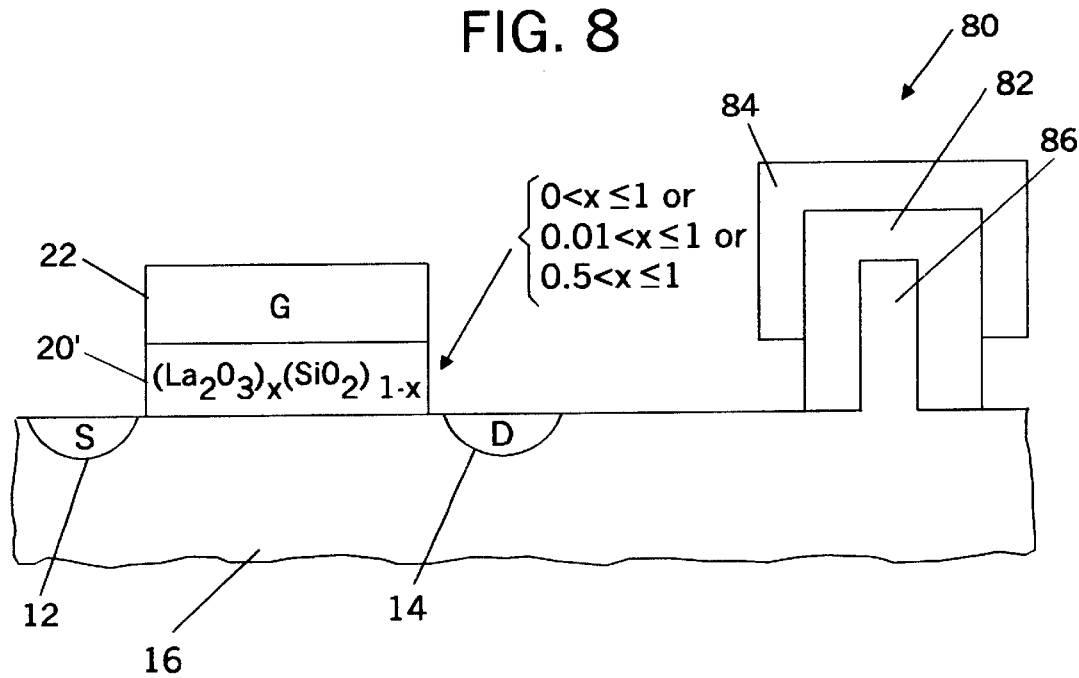

As described above in connection with FIGS. 1–6, lanthanum oxide-based materials may be used as gate dielectrics for integrated circuit field effect transistors. FIGS. 7 and 8 illustrate field effect transistors including lanthanum oxide-based gate dielectrics according to embodiments of the present invention, that also are integrated with capacitors having lanthanum oxide-based capacitor dielectrics according to embodiments of the present invention. As is well known to those having skill in the art, capacitors and field effect transistors may be integrated in a single integrated circuit substrate, and are widely used, for example, to fabricate Dynamic Random Access Memory (DRAM) devices, other memory devices and/or other integrated circuit devices.

Thus, referring to FIG. 7, a field effect transistor including gate dielectrics comprising lanthanum oxide as was shown in FIG. 2, is integrated with a capacitor having a capacitor dielectric 72 comprising lanthanum oxide and a top capacitor electrode 74. The bottom capacitor electrode may comprise a portion of the integrated circuit substrate 16 or may be a separate bottom electrode. As shown in FIG. 7, the integrated circuit capacitor 70 is formed in a trench, and is commonly referred to as a "trench capacitor". Details for fabricating trench capacitors are well known to those having skill in the art. However, it will be understood that the field effect transistor of FIG. 7 may correspond to any of the embodiments of FIGS. 1–5 that were described above. Moreover, the capacitor dielectric layer 72 and the gate insulating layer 20 may be formed simultaneously as portions of a single layer or sublayers, and the upper electrode 74 and the gate electrode 22 also may be formed simultaneously as portions of a single layer or sublayers. In alternate embodiments, different layers may be used for the capacitor dielectric 72 and the gate insulating layer 20 and/or different layers may be used for the top electrode 74 and the gate electrode 22. Methods that were described in FIG. 6 may be used to form the integrated circuit capacitor 70.

Referring now to FIG. 8, a cross-sectional view of integrated circuit field effect transistors including lanthanum oxide-based gate dielectrics according to embodiments of the invention and integrated circuit capacitors including lanthanum oxide-based capacitor dielectrics according to embodiments of the invention, is shown. As was the case in FIG. 7, the field effect transistors may correspond to any of the embodiments described in connection with FIGS. 1–6. As shown in FIG. 8, the capacitor 80 includes a capacitor dielectric 82 and an upper capacitor electrode 84. The lower capacitor electrode may comprise a portion of the silicon substrate 16, or may be a separate layer. The capacitor 80 is shown stacked on the substrate 16, to form a well known "stacked capacitor" structure. The lower electrode 86 may include hemispherical grain silicon to increase the surface area thereof using techniques well known to those having skill in the art. As was the case with FIG. 7, the capacitor dielectric 82 and the gate dielectric 20 may comprise portions of a single layer or sublayers comprising lanthanum oxide, and the upper capacitor electrode 84 and the gate electrode 22 may comprise portions of a single layer or sublayers comprising any of the materials described above and/or other materials.

Finally, it will be understood by those having skill in the art that the capacitors 70 and 80 of FIGS. 7 and 8, respectively, need not be integrated with field effect transistors as shown in FIGS. 7 and 8. Rather, capacitors 70 and 80 may be integrated separately to provide lanthanum oxide-based capacitor dielectrics for integrated circuit capacitors.

EXAMPLES

The following examples are provided for illustrative purposes and shall not be construed as limiting.

Figure 9A:
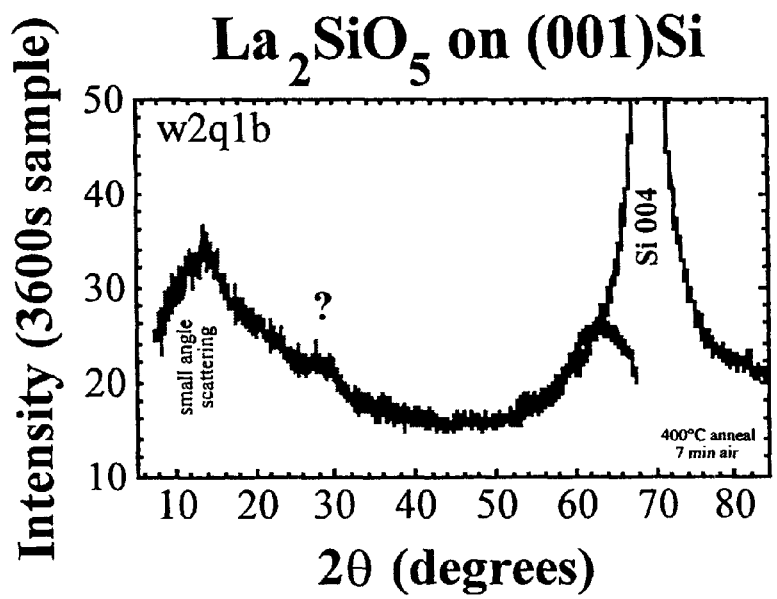
FIGS. 9A–9C graphically illustrate X-ray diffraction patterns for samples of lanthanum oxide-based gate dielectrics according to embodiments of the present invention in an as-deposited state, after a 900° C. anneal and after a 1000° C. anneal, respectively.
Figure 9B:
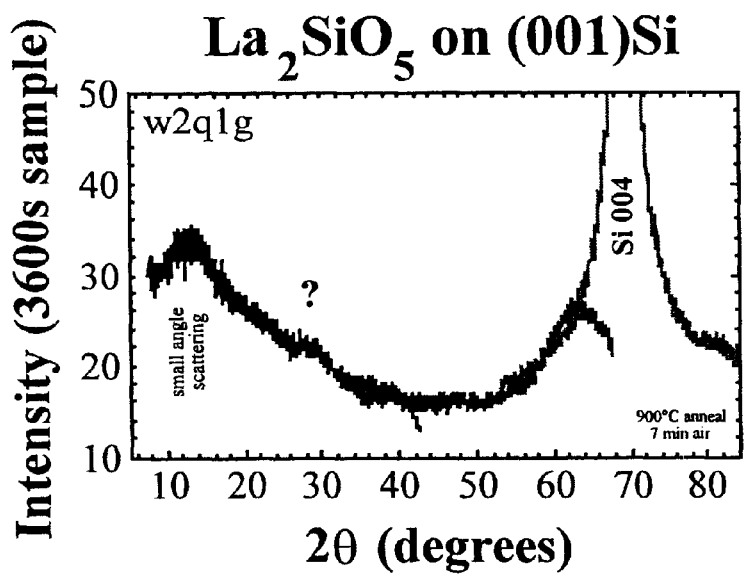
Figure 9C:
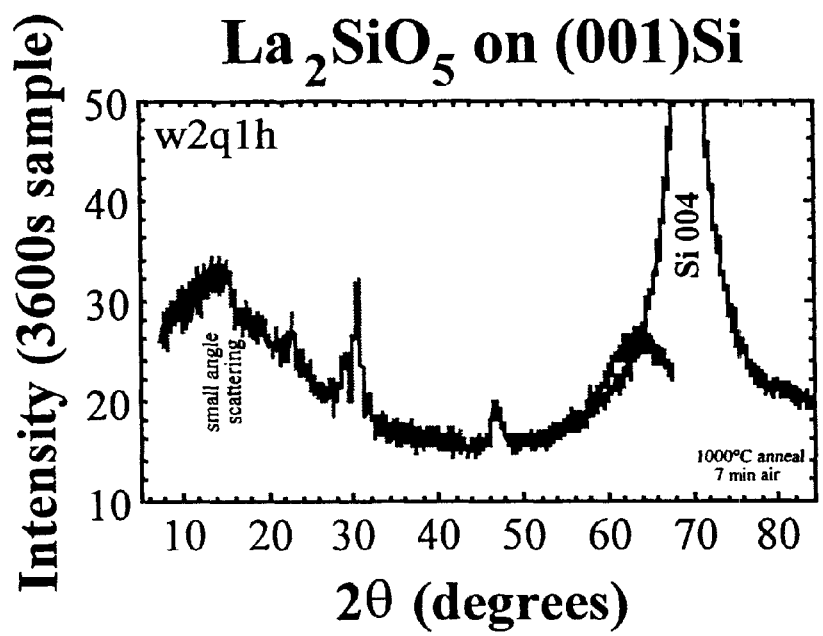

Dielectric layers according to embodiments of the present invention were fabricated as was described in connection with FIG. 6. X-ray diffraction patterns were collected. In general, diffraction data can be collected from dielectric layers as thin as 100 Å. FIGS. 9A–9C illustrate diffraction patterns for 100 Å samples. FIG. 9A illustrates an as-deposited sample (Block 63), FIG. 9B illustrates a sample annealed (Block 64) at 900° C., and FIG. 9C illustrates a sample annealed at 1000° C. As can be seen from FIGS. 9A–9C, these samples appear to be crystallization resistant until about 900° C., so that amorphous layers are provided.

A gate electrode may be patterned, for example using conventional lithography and liftoff (Block 65), to form capacitors. Capacitor sizes may range from 50 $\mu$m to 400 $\mu$m squares, and may be within 1% of the nominally quoted values.

Capacitance-Voltage (C-V) and Current-Voltage (I-V) curves were obtained. Capacitance and leakage currents were measured as a function of voltage using an HP 4192A impedance analyzer and a Keithly electrometer. Backside contacts were made by rigorously scratching the wafer backside with a diamond scribe, then rubbing a high purity aluminum block across the scratches. This process can fill the scratches with aluminum and can provide robust electrical connection to the silicon substrate. Several dot capacitors were selected on all samples and C-V and I-V measurements were made as a function of capacitor size and measurement frequency. Multiple sizes and frequencies were used to insure that the substrate doping was sufficient relative to the device capacitance, that backside contacts were reliable, and that strong dielectric dispersion did not exist in the dielectric layers. Selected samples also were characterized by TEM and medium energy ion scattering spectrometry.

Figure 10:
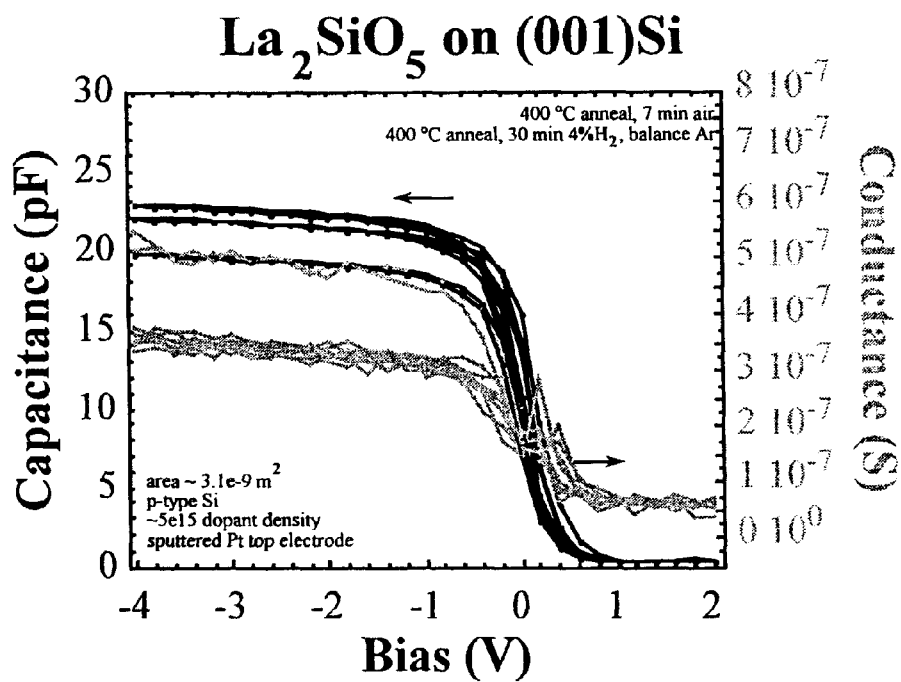
FIG. 10 graphically illustrates Capacitance-Voltage (C-V) curves for samples of lanthanum oxide-based gate dielectrics according to embodiments of the present invention.

In general, the capacitance values measured for the samples appear to depend very little on the annealing temperature, and appear to scale appropriately with the calibrated film thickness. FIG. 10 is a sample C-V curve for a 100 Å thick lanthanum silicate sample. The data was taken at 100 kilohertz. Multiple curves are shown corresponding to five adjacent capacitors. The scatter in the data corresponds in part to variations in top electrode size. Leakage current measurements were collected for these films and reveal values near $1 \times 10^{-7}$ amp/cm$^2$ at −4 volts applied voltage.

Evaluation of available thermodynamic data indicates thermodynamic stability of lanthanum in contact with silicon at up to about 1000° K. See Hubbard et al., Thermodynamic Stability of Binary Oxides on Silicon, Journal of Materials Research, Vol. 11, No. 11, 1996, pp. 2757–2776. However, this stability may only be expected under equilibrium conditions. During deposition and post-deposition processing, equilibrium conditions may not be achieved. In the present examples, the deviations from equilibrium pertain to oxygen partial pressure. The limiting cases of oxygen partial pressure can include a high pressure situation where $SiO_2$ formation at the dielectric layer-substrate interface is suspected, and a low pressure situation where decomposition of the dielectric may occur.

Figure 11:
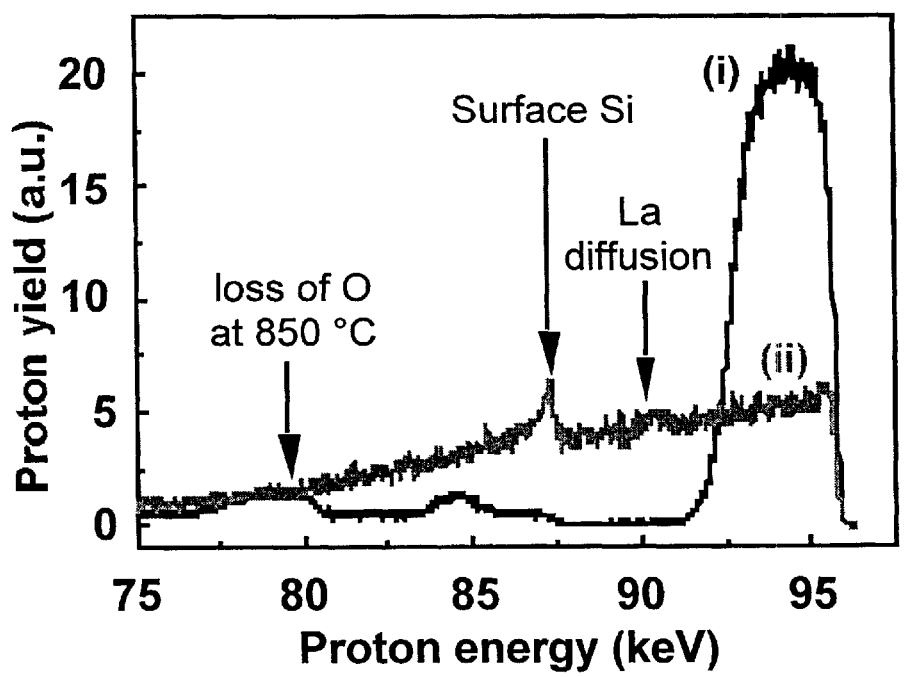
FIG. 11 graphically illustrates ion scattering spectra for lanthanum silicate-based gate dielectrics in an as-deposited state and after a $10^{-8}$ Torr vacuum anneal at 850° C.

Both situations have been observed for lanthanum dielectrics. FIG. 11 shows ion scattering (MEIS) spectra taken for a $La_2O_3.SiO_2$ alloy deposited by co-evaporation of La and Si in the presence of $O_2$ in the as-deposited state (i), and after an 850° C. $10^{-8}$ Torr vacuum anneal for several minutes (ii). The as-deposited film composition was $(La_2O_3)_{0.5}.(SiO_2)_{0.5}$ which corresponds to the $La_2SiO_5$ crystalline silicate analog. Comparing the two spectra, the alloy decomposition can be clearly seen. The thermodynamics may predict stability of lanthanum (and a mixture of lanthanum and silica) on Si at these temperatures. However, from FIG. 11 it appears that stability is not achieved.

Without wishing to be bound by any theory, it appears that the observed decomposition occurs as a result of oxygen loss. Oxygen loss can occur via direct oxygen loss from the lanthanum-containing layer, and/or via $SiO_2$ desorption. Indications of $SiO_2$ desorption from silica alloyed films has been observed elsewhere. In either case, it appears that stability presently may not be achieved in these, or more aggressive, annealing atmospheres.

Figure 12:
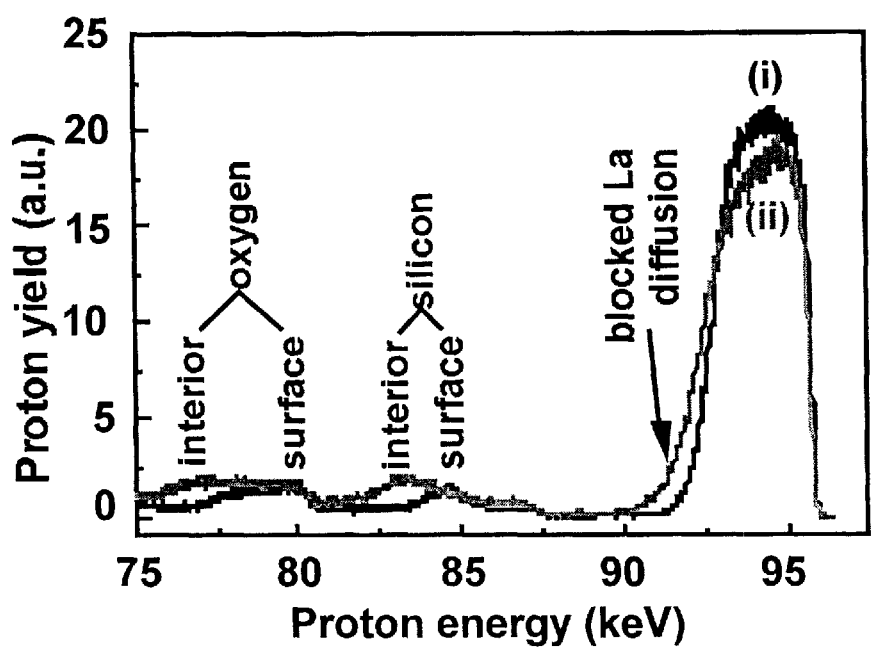
FIG. 12 graphically illustrates ion scattering spectra for lanthanum silicate-based gate dielectrics in an as-deposited state and after an air anneal at 850° C. for several minutes.

The low pressure situation can be seen in FIG. 12 where MEIS spectra are shown for an identical film that is annealed to the same temperatures in an air atmosphere. From the spectra of FIG. 12, it appears that the same type of decomposition is not occurring. However, the increased signals appear to indicate sub-surface $SiO_2$ growth. In FIG. 12, the lanthanum spectrum changes negligibly, while the silicon and oxygen signals appear to indicate their location at greater depths within the dielectric stack. Without wishing to be bound by any theory, it appears that the lanthanum-containing film is stable, i.e., does not react with the substrate, but can allow atmospheric oxygen to diffuse to the silicon interface where a sub-surface film can grow.

The films used in these experiments were 100 Å thick. If a thinner film were used in the oxidizing anneal experiment, the temperature at which sub-surface oxide growth was realized may be even lower, since diffusion through a thinner surface layer may occur more rapidly.

These results appear to demonstrate limiting cases of stability for lanthanum oxides in contact with silicon. The low pressure case appears to indicate a propensity of the material to decompose at high temperatures and subsequently react, while the oxidizing conditions suggest that thermodynamic stability is observed, but oxygen kinetics are such that rapid sub-surface silica growth may predominate.

With this understanding, it should be possible to find an intermediate pressure at which oxide stability can be maintained, and at which sub-surface oxide growth can be sufficiently slow so as to reduce and preferably minimize formation of a low dielectric constant layer between the lanthanum oxide and the silicon surface. If such a pressure is found, gate dielectric stability at high temperatures may be improved.

Figure 13:
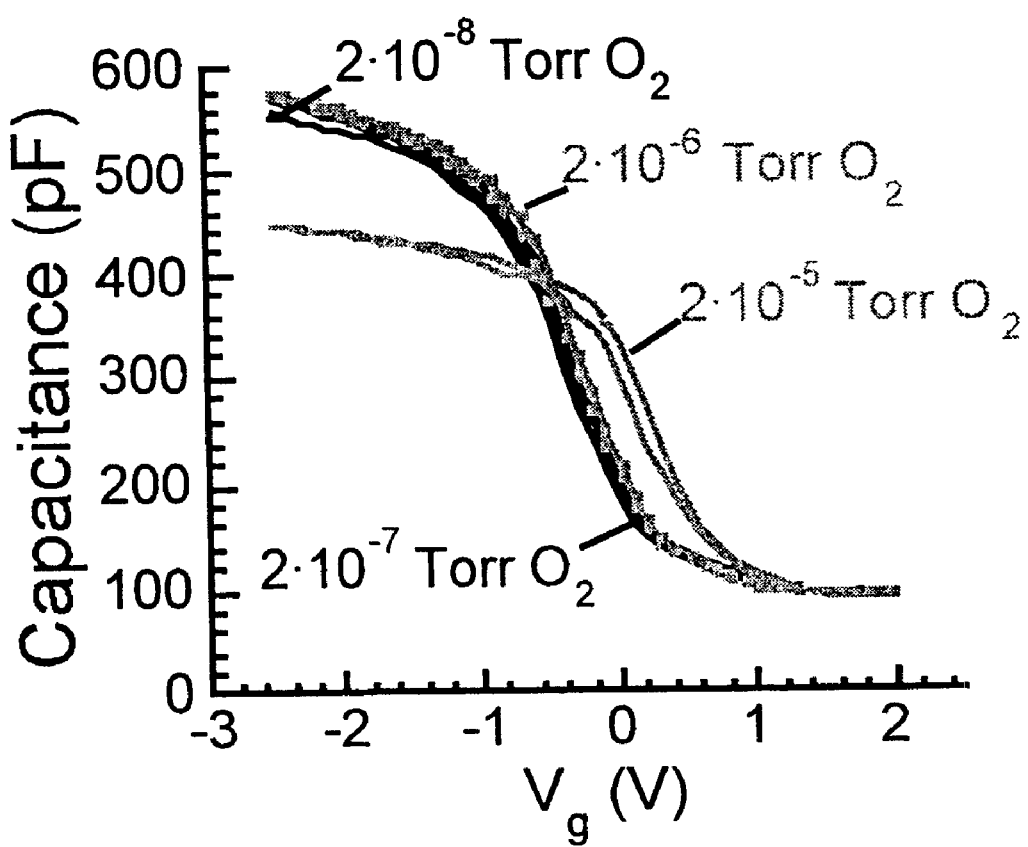
FIG. 13 graphically illustrates C-V curves for a 20 Å thick $La_2O_3$ film with an approximately 10 Å thick chemical silicon dioxide interface, and annealed at 900° C. under various oxygen partial pressures.

To investigate this possibility, sets of lanthanum gate dielectrics were prepared and annealed at constant temperature, but as a function of oxygen ambient. After this annealing, electrical properties were measured from dot capacitors with platinum gate electrodes. FIG. 13 shows the C-V data for a 20 Å thick $La_2O_3$ film deposited on HF last annealed to 900° C. for a 5 minute dwell as a function of oxygen partial pressure. At an oxygen partial pressure of $2 \cdot 10^{-5}$ Torr there is a clear drop in the capacitance, as well as a shift in the C-V trace.

Figure 14:
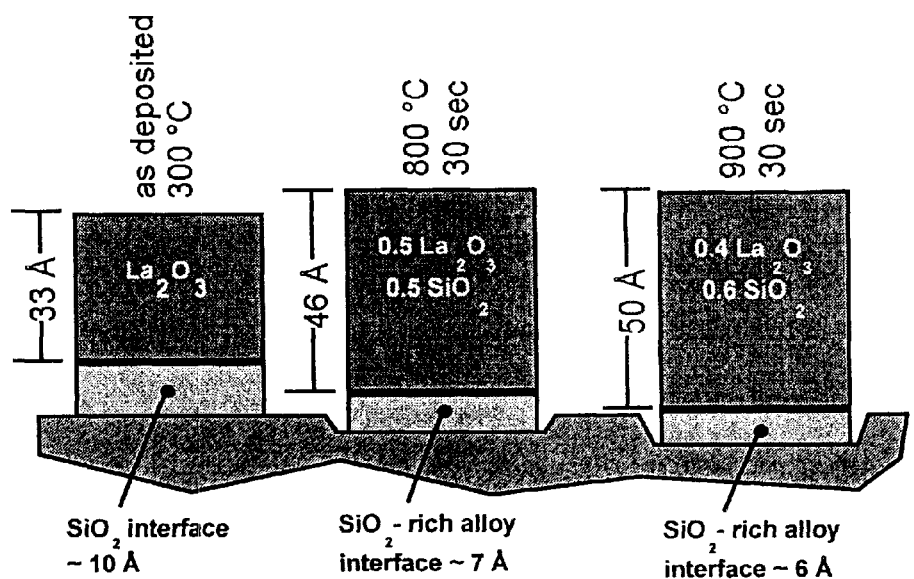
FIG. 14 graphically illustrates ion scattering measurements on 20 Å lanthanum films that are deposited on a thin chemical oxide.

Without wishing to be bound by any theory of operation, the drop in capacitance may be attributed to a combination of sub-surface oxide formation and subsequent reaction with the $La_2O_3$ layer to form a silicate layer. This may suggest that at $2 \times 10^{-5}$ Torr, interfacial silica may form via oxygen diffusion. In order to support this hypothesis, additional $La_2O_3$ films were prepared under oxidizing conditions that can promote sub-surface silica formation. In this case, 20 Å to 30 Å thick $La_2O_3$ films were deposited on chemical oxide surfaces and annealed to 800° C. and 900° C. for 30 seconds in flowing nitrogen in a rapid thermal annealing furnace. Both as-deposited and as-annealed samples were measured by MEIS. FIG. 14 summarizes the MEIS results. As seen in FIG. 14, after exposure to high temperatures in an oxidizing ambient, reactions appear to take place which result in silicate formation. From these measurements, a reaction model may be hypothesized which can accommodate the predicted thermodynamic stability of lanthanum in contact with silicon and the observations of reactions from MEIS.

In this mechanism, the originally deposited lanthanum film does not react with silicon. Rather, it reacts with a subsurface silica layer. This silica layer forms by oxygen diffusion through the $La_2O_3$ layer. After this thermal oxidation, the $La_2O_3$ layer is in contact with $SiO_2$, in which case silicate formation may occur. Thermodynamic data does not appear to be available for the lanthanum silicate crystalline phases. However, examination of the phase diagram for the $La_2O_3$—$SiO_2$ binary system may provide some insight.

Figure 15:
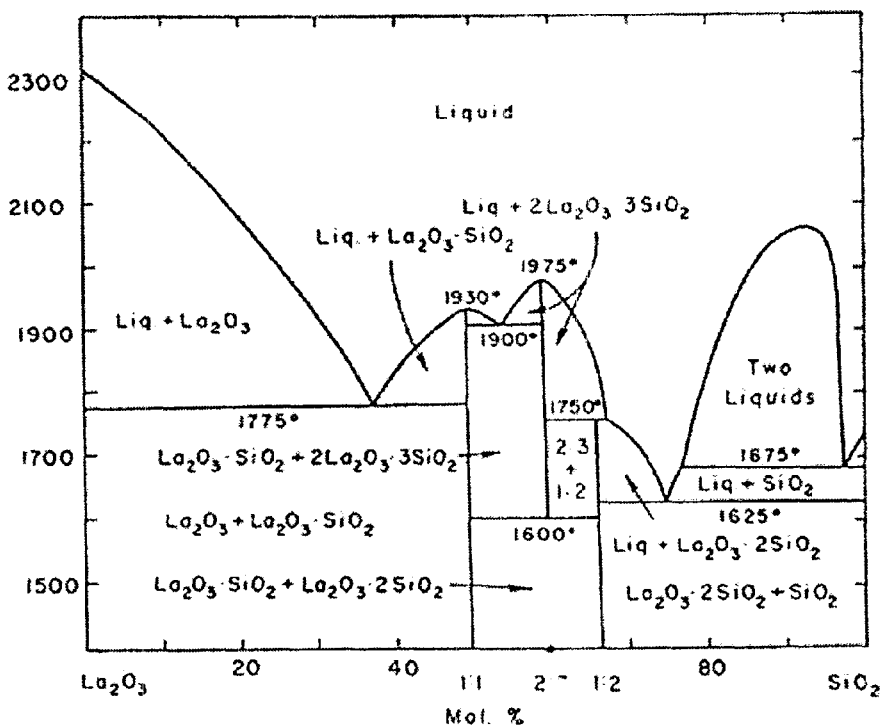
FIG. 15 is a phase diagram for the $La_2O_3$—$SiO_2$ binary system.

FIG. 15 shows a published phase diagram for this system. The features of primary interest appear to be the line compositions corresponding to $La_2O_3.SiO_2$ and $La_2O_3.2SiO_2$. These line compositions extend to low temperatures and melt congruently. Without wishing to be bound by any theory of operation, this may suggest that at the anneal temperatures used, depending on the quantity of silica present, the silicate phases would be thermodynamically preferred, and the congruent melting may provide that no kinetic limitation would exist to impede mixing. If, for example, the silicate phases formed via a peritectic reaction, kinetic limitations from slow solid state diffusion may impede the reactions.

From these considerations it is possible to explain the drop in capacitance in FIG. 13 by interface formation and subsequent reaction. Note that for oxygen pressures between $2 \times 10^{-8}$ Torr and $2 \times 10^{-6}$ Torr, no changes were observed in the capacitance density. This suggests that within this pressure window, a sufficient quantity of oxygen is present to prevent dielectric degradation, but not a sufficient amount to cause interfacial oxide growth at rates that are significant in the time scales of interest. This result suggests that stability can be achieved in these systems, if the pressure is carefully controlled. This may allow lanthanum oxide dielectric layers to be formed that can withstand subsequent processing-temperatures of up about 1000° to about 1050° C. or more.

Thus, electrical and TEM characterization indicates that the cation fluxes can be effectively oxidized while the underlying substrate can remain chemically stable. Specifically, photoelectron spectroscopy shows fully oxidized metal, while high-resolution cross sectional transmission electron microscopy shows as-deposited interface layers between the Si substrate and lanthanum silicate film less than 5 Å in thickness. Once deposition is complete, the wafers can be annealed in oxidizing, inert, and/or reducing atmospheres for electrical optimization. The oxidizing and inert anneals may be performed in an atmosphere controlled rapid thermal processor, while the inert (i.e., forming gas) anneals may be performed in a tube furnace.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A gate dielectric for an integrated circuit field effect transistor, the gate dielectric comprising:
    an amorphous layer comprising an alloy of lanthanum oxide and silicon oxide.

2. A gate dielectric according to claim 1 wherein the amorphous layer comprising an alloy of lanthanum oxide and silicon oxide comprises:
    a layer comprising $(La_2O_3)_x(SiO_2)_{1-x}$, where $0 < x \leq 1$.

3. A gate dielectric according to claim 2, where $0.01 < x \leq 1$.

4. A gate dielectric according to claim 2, where $0.5 < x \leq 1$.

5. A gate dielectric according to claim 2, where $x = 0.5$.

6. A gate dielectric according to claim 2 wherein the layer comprising $(La_2O_3)_x(SiO_2)_{1-x}$ comprises a uniform layer comprising $(La_2O_3)_x(SiO_2)_{1-x}$.

7. A gate dielectric according to claim 2 wherein the layer comprising $(La_2O_3)_x(SiO_2)_{1-x}$ comprises:
    a first sublayer comprising $(La_2O_3)_{x1}(SiO_2)_{1-x1}$; and
    a second sublayer comprising $(La_2O_3)_{x2}(SiO_2)_{1-x2}$;
    where $x1 \leq x2$.

8. A gate dielectric for an integrated circuit field effect transistor, the gate dielectric comprising:
    a first sublayer comprising $(La_2O_3)_{x1}(SiO_2)_{1-x1}$;
    a second sublayer comprising $(La_2O_3)_{x2}(SiO_2)_{1-x2}$ on the first sublayer, where $x1 \leq x2$; and
    a third sublayer comprising $(La_2O_3)_{x3}(SiO_2)_{1-x3}$ on the second sublayer, opposite the first sublayer, where $x3 \leq x2$, and where $0 < x1, x2, x3 \leq 1$.

9. A gate dielectric according to claim 1 in combination with a capacitor dielectric for an integrated circuit capacitor, the capacitor dielectric comprising a layer comprising lanthanum oxide.

10. A field effect transistor comprising:
    spaced apart source and drain regions in an integrated circuit substrate; and
    an insulated gate on the integrated circuit substrate, the insulated gate comprising a gate dielectric amorphous layer comprising an alloy of lanthanum oxide and silicon oxide on the integrated circuit substrate and a gate electrode on the gate dielectric amorphous layer comprising an alloy of lanthanum oxide and silicon oxide, opposite the integrated circuit.

11. A field effect transistor according to claim 10 wherein the gate dielectric amorphous layer comprising an alloy of lanthanum oxide and silicon oxide comprises:
    a gate dielectric layer comprising $(La_2O_3)_x(SiO_2)_{1-x}$, where $0 < x \leq 1$.

12. A field effect transistor according to claim 11, where $0.01 < x \leq 1$.

13. A field effect transistor according to claim 11, where $0.5 < x \leq 1$.

14. A field effect transistor according to claim 11, where $x = 0.5$.

15. A field effect transistor according to claim 11 wherein the gate dielectric layer comprising $(La_2O_3)_x(SiO_2)_{1-x}$ comprises a uniform gate dielectric layer comprising $(La_2O_3)_x(SiO_2)_{1-x}$.

16. A field effect transistor according to claim 11 wherein the gate dielectric layer comprising $(La_2O_3)_x(SiO_2)_{1-x}$ comprises:
    a first sublayer comprising $(La_2O_3)_{x1}(SiO_2)_{1-x1}$, adjacent the integrated circuit substrate; and
    a second sublayer comprising $(La_2O_3)_{x2}(SiO_2)_{1-x2}$, opposite the integrated circuit substrate;
    where $x1 \leq x2$.

17. A field effect transistor comprising:
    spaced apart source and drain regions in an integrated circuit substrate; and
    an insulated gate on the integrated circuit substrate, the insulated gate comprising a gate dielectric layer comprising an alloy of lanthanum oxide and silicon oxide on the integrated circuit substrate and a gate electrode on the gate dielectric layer comprising an alloy of lanthanum oxide and silicon oxide, opposite the integrated circuit;
    wherein the gate dielectric layer comprising $(La_2O_3)_x(SiO_2)_{1-x}$ comprises:
        a first sublayer comprising $(La_2O_3)_{x1}(SiO_2)_{1-x1}$, adjacent the integrated circuit substrate;
        a second sublayer comprising $(La_2O_3)_{x2}(SiO_2)_{1-x2}$, on the first sublayer opposite the integrated circuit substrate, where $x1 \leq x2$; and
        a third sublayer comprising $(La_2O_3)_{x3}(SiO_2)_{1-x3}$ on the second sublayer, opposite the first sublayer, where $x3 \leq x2$, and where $0 < x1, x2, x3 \leq 1$.

18. A field effect transistor according to claim 10 wherein the gate electrode comprises at least one of polysilicon, TaN, Pt, Ru, RuO, Ir, IrO$_2$ and $Ta_{1-x}Si_xN_y$.

19. A field effect transistor according to claim 10 wherein the field effect transistor is an n-channel field effect transistor and wherein the gate electrode comprises at least one of polysilicon, TaN, $Ta_{1-x}Si_xN_y$ and IrO$_2$.

20. A field effect transistor according to claim 10 wherein the field effect transistor is a p-channel field effect transistor and wherein the gate electrode comprises at least one of polysilicon, Pt, Ru, RuO, Ir and IrO$_2$.

21. A field effect transistor according to claim 10 in combination with a capacitor on the integrated circuit substrate, the capacitor comprising first and second electrodes and a capacitor dielectric therebetween, the capacitor dielectric comprising a layer comprising lanthanum oxide.

22. An integrated circuit complementary field effect transistor pair comprising:
    an n-channel insulated gate field effect transistor and a p-channel insulated gate field effect transistor in an integrated circuit substrate, each of which comprises an insulated gate including a gate dielectric amorphous layer comprising an alloy of lanthanum oxide and silicon oxide on the integrated circuit substrate and a gate electrode on the gate dielectric layer comprising an alloy of lanthanum oxide and silicon oxide, opposite the integrated circuit substrate.

23. An integrated circuit complementary field effect transistor according to claim 22 wherein the gate dielectric amorphous layer comprising an alloy of lanthanum oxide and silicon oxide comprises:

a gate dielectric layer comprising $(La_2O_3)_x(SiO_2)_{1-x}$, where $0<x\leq 1$.

24. An integrated circuit complementary field effect transistor according to claim 23, where $0.01<x\leq 1$.

25. An integrated circuit complementary field effect transistor pair according to claim 23, where $0.5<x\leq 1$.

26. An integrated circuit complementary field effect transistor pair according to claim 23, where $x=0.5$.

27. An integrated circuit complementary field effect transistor pair comprising:

an n-channel insulated gate field effect transistor and a p-channel insulated gate field effect transistor in an integrated circuit substrate, each of which comprises an insulated gate including a gate dielectric layer comprising an alloy of lanthanum oxide and silicon oxide on the integrated circuit substrate and a gate electrode on the gate dielectric layer comprising an alloy of lanthanum oxide and silicon oxide, opposite the integrated circuit substrate;

wherein the gate dielectric layer comprising $(La_2O_3)_x(SiO_2)_{1-x}$ comprises:

a first sublayer comprising $(La_2O_3)_{x1}(SiO_2)_{1-x1}$;

a second sublayer comprising $(La_2O_3)_{x2}(SiO_2)_{1-x2}$ on the first sublayer, where $x1\leq x2$; and a third sublayer comprising $(La_2O_3)_{x3}(SiO_2)_{1-x3}$ on the second sublayer, opposite the first sublayer, where $x3\leq x2$, and where $0<x1, x2, x3\leq 1$.

28. An integrated circuit complementary field effect transistor pair according to claim 23 wherein the gate dielectric layer comprising $(La_2O_3)_x(SiO_2)_{1-x}$ comprises:

a first sublayer comprising $(La_2O_3)_{x1}(SiO_2)_{1-x1}$; and a second sublayer comprising $(La_2O_3)_{x2}(SiO_2)_{1-x2}$;

where $x1\leq x2$.

29. An integrated circuit complementary field effect transistor pair according to claim 22 in combination with a capacitor on the integrated circuit substrate, the capacitor comprising first and second electrodes and a capacitor dielectric therebetween, the capacitor dielectric comprising a layer comprising lanthanum oxide.

30. An integrated circuit complementary field effect transistor pair according to claim 22 wherein the gate electrodes of the n-channel insulated gate field effect transistor and of the p-channel insulated gate field effect transistor comprise at least one of polysilicon, TaN, Pt, Ru, RuO, Ir, $IrO_2$ and $Ta_{1-x}Si_xN_y$.

31. An integrated circuit complementary field effect transistor pair according to claim 22 wherein the gate electrode of the n-channel field effect transistor comprises at least one of polysilicon, TaN, $Ta_{1-x}Si_xN_y$ and $IrO_2$.

32. An integrated circuit complementary field effect transistor pair according to claim 22 wherein the gate electrode for the p-channel field effect transistor comprises at least one of polysilicon, Pt, Ru, RuO, Ir and $IrO_2$.

33. An integrated circuit complementary field effect transistor pair according to claim 31 wherein the gate electrode for the p-channel field effect transistor comprises at least one of polysilicon, Pt, Ru, RuO, Ir and $IrO_2$.

34. An integrated circuit complementary field effect transistor pair according to claim 22 in combination with a capacitor on the integrated circuit substrate, the capacitor comprising first and second electrodes and a capacitor dielectric therebetween, the capacitor dielectric comprising a layer comprising lanthanum oxide.

* * * * *

UNITED STATES PATENT AND TRADEMARK OFFICE
CERTIFICATE OF CORRECTION

PATENT NO.    : 6,531,354 B2
DATED         : March 11, 2003
INVENTOR(S)   : Maria et al.

It is certified that error appears in the above-identified patent and that said Letters Patent is hereby corrected as shown below:

Column 14,
Line 61, should read -- gate electrode on the gate dielectric amorphous layer comprising an --

Column 15,
Claim 27 should read:
-- 27.   An integrated circuit complementary field effect transistor according to Claim 23 wherein the gate dielectric layer comprising $(La_2O_3)_x(SiO_2)_{1-x}$ comprises a uniform gate dielectric layer comprising $(La_2O_3)_x(SiO_2)_{1-x}$. --

Signed and Sealed this

Eleventh Day of May, 2004

JON W. DUDAS
*Acting Director of the United States Patent and Trademark Office*